(12) United States Patent
Gao (10) Patent No.: US 12,048,117 B2
(45) Date of Patent: Jul. 23, 2024

(54) IT COOLING ENCLOSURES FOR ENERGY STORAGE BACKUP SYSTEMS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

(*) Notice: Subject to any disclaimer, the term of this patent is extended or adjusted under 35 U.S.C. 154(b) by 177 days.

(21) Appl. No.: 17/691,841

(22) Filed: Mar. 10, 2022

(65) Prior Publication Data

US 2023/0292465 A1 Sep. 14, 2023

(51) Int. Cl.
*H05K 7/20* (2006.01)
*H01M 10/613* (2014.01)
*H01M 10/627* (2014.01)
*H01M 10/6567* (2014.01)

(52) U.S. Cl.
CPC ...... *H05K 7/20272* (2013.01); *H01M 10/613* (2015.04); *H01M 10/627* (2015.04); *H01M 10/6567* (2015.04); *H05K 7/20236* (2013.01); *H05K 7/20772* (2013.01); *H05K 7/20836* (2013.01); *H01M 2220/10* (2013.01)

(58) Field of Classification Search
None
See application file for complete search history.

(56) References Cited

U.S. PATENT DOCUMENTS

| | | | | |
|---|---|---|---|---|
| 9,048,483 | B2* | 6/2015 | Nakamura | H01M 10/625 |
| 10,015,912 | B2* | 7/2018 | Inano | H05K 7/20236 |
| 10,505,163 | B2* | 12/2019 | Harris | H01M 10/6569 |
| 10,791,647 | B1* | 9/2020 | Miyamura | H05K 7/1487 |
| 10,998,595 | B2* | 5/2021 | Winger | H01M 10/0445 |
| 11,134,590 | B2* | 9/2021 | Wang | H05K 7/20927 |
| 11,155,150 | B2* | 10/2021 | Stephens | B60K 11/02 |
| 11,552,350 | B2* | 1/2023 | Okuno | H01M 10/6567 |
| 11,706,901 | B2* | 7/2023 | Wu | H05K 7/20781 |
| | | | | 361/699 |
| 2010/0285347 | A1* | 11/2010 | Saito | H01M 50/264 |
| | | | | 429/120 |
| 2019/0044200 | A1* | 2/2019 | Motoyoshi | H01M 50/583 |
| 2021/0104788 | A1* | 4/2021 | Shao | H01M 10/613 |
| 2023/0051254 | A1* | 2/2023 | Azzouz | H01M 10/625 |

* cited by examiner

*Primary Examiner* — Courtney L Smith
(74) *Attorney, Agent, or Firm* — WOMBLE BOND DICKINSON (US) LLP (57) ABSTRACT

An information technology (IT) enclosure includes an IT container having immersion coolant self-contained therein, one or more cooler trays and one or more dedicated battery spacings that are alternately arranged in a series manner within the IT container. Each cooler tray to house a cooler, each battery spacing to house one or more rows of battery packs. The IT enclosure includes a supply channel disposed at a first side of the IT container, and a return channel and a fluid pump disposed at another side of the IT container. Where, when in operation, the immersion coolant circulates amongst the alternate one or more rows of battery packs and coolers to transfer a thermal load from the one or more rows of battery packs to the coolers.

19 Claims, 6 Drawing Sheets

IT COOLING ENCLOSURES FOR ENERGY STORAGE BACKUP SYSTEMS

FIELD OF THE INVENTION

Embodiments of the present invention relate generally to data center and energy storage system cooling. More particularly, embodiments of the invention relate to information technology (IT) cooling enclosures for energy storage backup systems.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers.

The power backup systems in a data center is just as critical. Power backup systems supply power to the servers in the data center in order to provide backup power when there is a failure in the utility power supply. For example, when the utility power supply is offline, power is typically supplied to the servers by discharging the energy storage modules such as battery modules in the backup power system. When the utility power supply is online, the energy storage modules are recharged by the utility power supply. The discharge/recharge cycles generate a large amount of heat spots at the energy storage modules, especially for fast charging/discharging, high density battery modules.

The previous cooling solutions for battery modules consists of air cooling or liquid cooling. These solutions may not enable fast charging/discharging, high power density, and high packaging densities.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The current work proposes a design for an IT enclosure and cooling system for energy storage system using single phase immersion coolant. The energy storage system can include high package density battery cells (such as lithium-ion cells) that are operating in active cycles, including charging and discharging, as well as passive storage cycles.

According to a first aspect, an information technology (IT) enclosure includes an information technology (IT) container having immersion coolant self-contained therein. The IT enclosure includes one or more cooler trays and one or more dedicated battery spacings that are alternately arranged in a series manner within the IT container, each cooler tray to house a cooler, each battery spacing to house one or more rows of battery packs, each battery pack includes a number of battery cells arranged therein. The IT enclosure includes a supply channel disposed at a first side of the IT container to supply the immersion coolant, the immersion coolant is circulated to the alternate one or more cooler trays housing the coolers and the one or more dedicated battery spacings housing the battery packs, where, when in operation, the immersion coolant transfers a thermal load from the one or more rows of battery packs to the coolers. The IT enclosure includes a return channel disposed at another side of the IT container and a fluid pump disposed at the supply or return channel to pump the immersion coolant from the return channel back to the supply channel to circulate the immersion coolant.

In one embodiment, the IT enclosure includes a bottom return channel disposed at a bottom portion of the IT container to return the recirculated immersion coolant from the return channel to the supply channel. In one embodiment, the IT enclosure includes a number of passageways disposed near, and in a direction of, the one or more cooler trays and the dedicated battery spacings that are arranged in the series manner, where the passageways enable immersion coolant to transfer a thermal load from the battery cells to one or more coolers.

In one embodiment, the IT enclosure is assembled modularly from a cooler system, a flow management system, and the IT container. In one embodiment, the immersion coolant is directed to one or more rows of battery packs for the battery packs to heat the immersion coolant, and the heat of the immersion coolant is extracted to a cooler before the immersion coolant is directed to another row of battery packs.

In one embodiment, the IT enclosure further includes a cooling fluid distributor to distribute cooling fluid from a central cooler to each of one or more coolers to extract heat from the one or more coolers. In one embodiment, the immersion coolant flows in a direction of the one or more cooler trays and the one or more dedicated battery spacings that are alternately arranged in the series manner.

In one embodiment, a flow rate of the immersion coolant at the IT enclosure is managed independently of a flow rate of immersion coolant at another IT enclosure, wherein the IT enclosure and the another IT enclosure are comprised in a cluster of IT enclosures of a cooling system. In one embodiment, a temperature of the plurality of battery cells is managed independently of a plurality of battery cells of another IT enclosure, wherein the IT enclosure and the another IT enclosure are comprised in a cluster of IT enclosures of a cooling system. In one embodiment, the immersion coolant at the IT enclosure is of a different type than an immersion coolant at another IT enclosure, wherein the IT enclosure and the another IT enclosure are comprised in a cluster of IT enclosures of a cooling system.

According to a second aspect, a cooling system includes a cluster of information technology (IT) enclosures arranged in a series manner, a central cooler, and a cooling fluid distributor coupled to the central cooler to distribute cooling fluid from the central cooler to the cluster of IT enclosures. Each of the cluster of IT enclosures includes an information technology (IT) container having immersion coolant self-contained therein. The IT enclosure includes one or more cooler trays and one or more dedicated battery spacings that are alternately arranged in a series manner within the IT container, each cooler tray to house a cooler, each battery spacing to house one or more rows of battery packs, each battery pack includes a number of battery cells arranged therein. The IT enclosure includes a supply channel disposed at a first side of the IT container to supply the immersion coolant, the immersion coolant is circulated to the alternate one or more cooler trays housing the coolers and the one or more dedicated battery spacings housing the battery packs, where, when in operation, the immersion coolant transfers a thermal load from the one or more rows of battery packs to the coolers. The IT enclosure includes a return channel disposed at another side of the IT container and a fluid pump disposed at the supply or return channel to pump the immersion coolant from the return channel back to the supply channel to circulate the immersion coolant.

According to a third aspect, a cooling system includes a cluster of information technology (IT) enclosures arranged in a series manner, a central cooler, and a cooling fluid distributor coupled to the central cooler to distribute cooling fluid from the central cooler to the cluster of IT enclosures. Each of the cluster of IT enclosures includes an IT container having immersion coolant contained therein. The IT enclosure includes one or more cooler trays and one or more dedicated battery spacings that are alternately arranged in a series manner within the IT container, each cooler tray to house a cooler, each battery spacing to house one or more rows of battery packs, each battery pack comprising a plurality of battery cells arranged therein. The IT enclosure includes a supply channel disposed at a first side of the IT container to supply the immersion coolant, the immersion coolant is circulated to the alternate one or more cooler trays housing the coolers and the one or more dedicated battery spacings housing the battery packs, wherein, when in operation, the immersion coolant transfers a thermal load from the one or more rows of battery packs to the coolers. The IT enclosure includes a return channel disposed at another side of the IT container and a fluid pump disposed at the supply or return channel to pump the immersion coolant from the return channel to a supply channel of an adjacent IT enclosure to circulate the immersion coolant to the adjacent IT enclosure, wherein the immersion coolant recirculates in a loop between the cluster of IT enclosures and the central cooler. Since the battery packs do not operate 7×24 as servers, therefore the present design enables more efficient localized cooling. The design arranges the battery packs having heat loads and the coolers in the series manner to ensure the cooling fluid is delivered to where and when the heat is being generated. In addition, the design enables a more localized cooling for the heat load. This does not only improve the cooling efficiency, but also enables on demand cooling since only the adjacent downstream cooler of the working battery pack can be configured to provide cooling.

Figure 1:
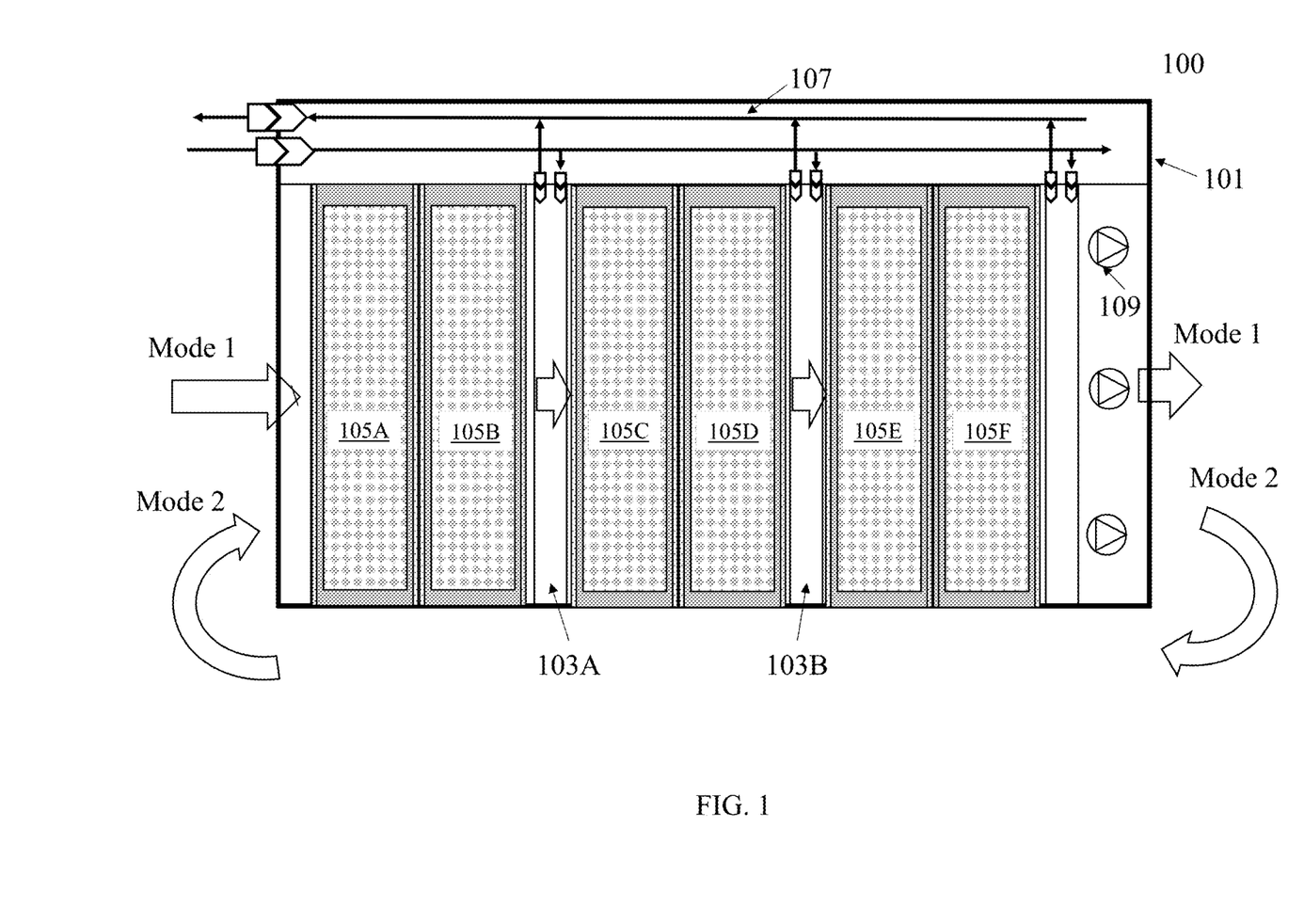
FIG. 1 is a block diagram illustrating an IT cooling enclosure for a battery backup system according to one embodiment.

FIG. 1 is a block diagram illustrating an IT cooling enclosure 100 for a battery backup system according to one embodiment. IT cooling enclosure 100 can include an IT container 101 that is assembled with a cooler system and a flow management system. The cooler system can include a cooling fluid distributor 107 that distributes a cooling fluid (such as water) to coolers 103A-103B. The coolers 103A-103B are arranged in a series manner in a flow direction of a single phase immersion coolant (or simply immersion coolant). The immersion coolant can be a non-conductive dielectric solution having a viscosity suitable for cooling battery packs. The battery backup system can contain rows of battery packs 105A-105F, each battery pack 401 includes a number of rows of battery cells 403 and the rows of battery packs 105A-105F are arranged among the cooler 103A-103B in the series manner. The battery cells can be high density cells such as lithium-ion cells, etc. As shown in FIG. 1, one or more rows of battery packs 105A-105F alternates each cooler 103A-103B in the series manner to provides a shortest distance from the battery packs to adjacent coolers.

Figure 3:
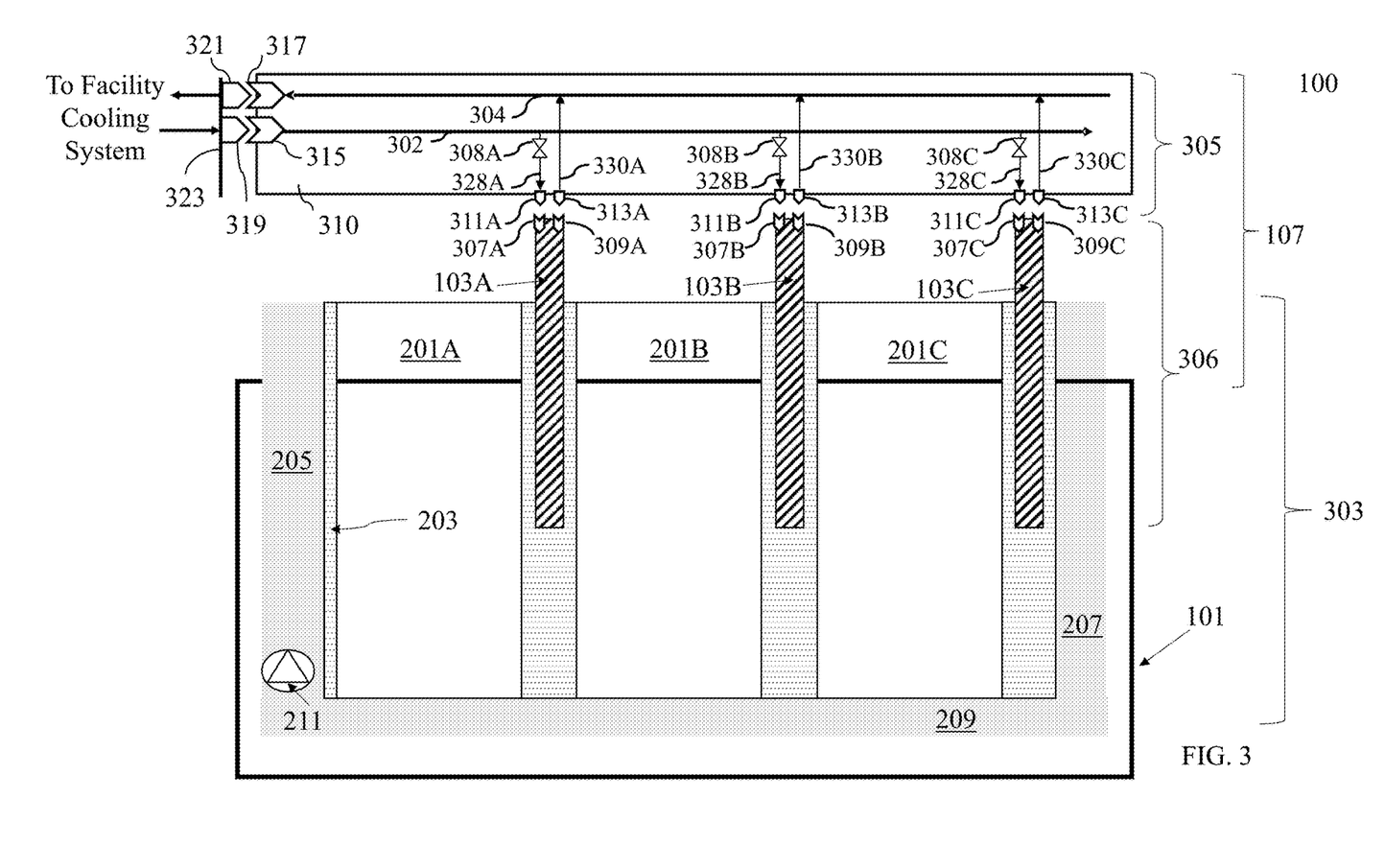
FIG. 3 is a block diagram illustrating separate system assembly including a cooler system, a flow management system and a main IT enclosure according to one embodiment.

Cooling fluid distributor 107 can include various connectors, fluid lines, valves, interfaces, and so on, which is further described with respect to FIG. 3.

Figure 2:
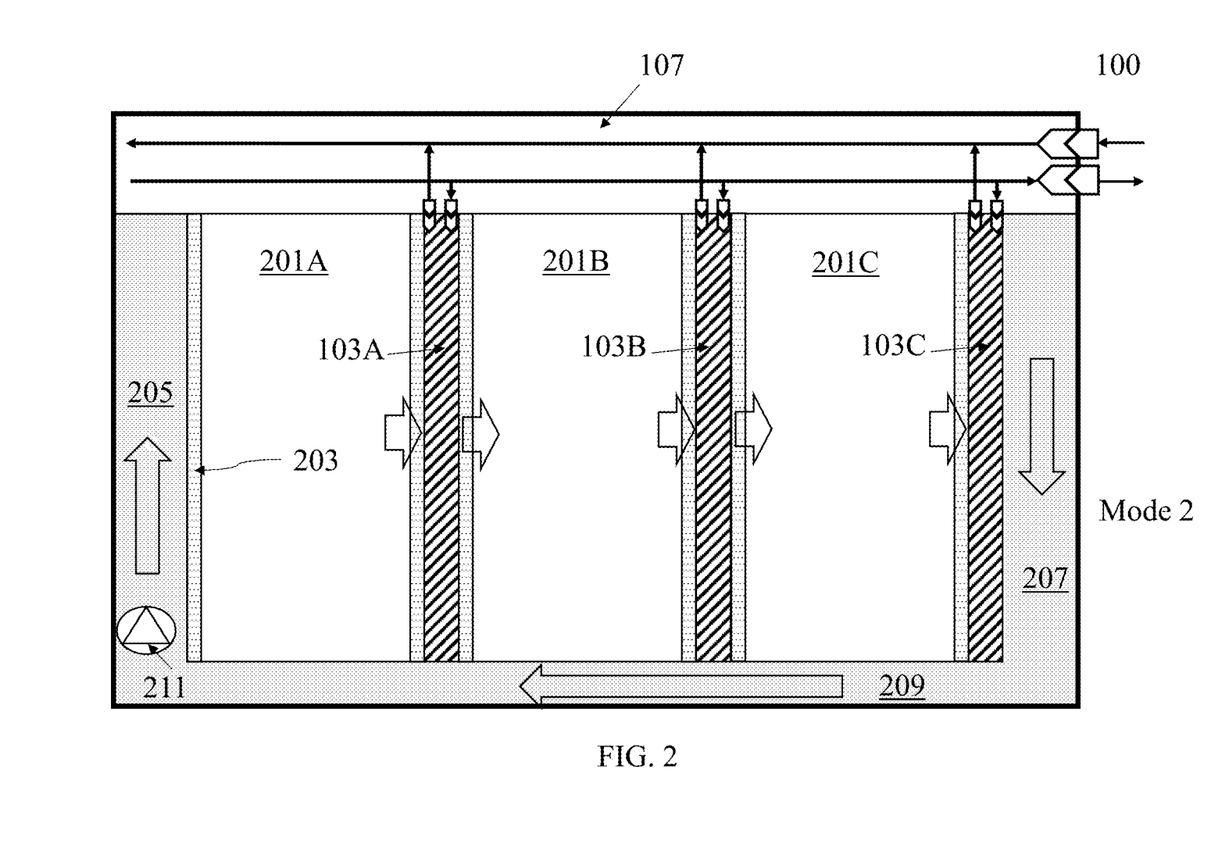
FIG. 2 is a block diagram illustrating components of an IT cooling enclosure according to one embodiment.

In one embodiment, the immersion coolant is being recirculated within the IT enclosure 100 by a flow management system via a supply and a return channels (as further shown in FIG. 2). The flow management system includes one or more fluid pumps 109 to direct the immersion coolant from the supply and to the return channels. When in operation, the immersion coolant is being pumped to pass by the battery cells and the coolers, where the immersion coolant is heated by the battery cells and then heat is being transferred from the immersion coolant to the coolers 103A-103B. Thereafter, heat is extracted from the coolers 103A-103B by the cooling fluid supplied to the coolers by the cooling fluid distributor 107.

Here, IT cooling enclosure 100 utilizes the immersion coolant as a medium to transfer heat generated by the battery packs to the coolers in a shortest path. In one embodiment, each cooler can have a different thermal density selected to meet the thermal requirements of adjacent battery packs and each of the battery packs can have a different thermal requirement.

In one embodiment, the fluid flow management is co-designed with the battery packs according to an arrangement of the battery packs including the battery cells therein. The battery cells can be arranged in locations where the immersion fluid flows nearest the battery cells, thereby eliminating hot spots among the battery cells. For example, the fluid flow management can include passageways disposed behind dedicated battery spacings that are housing rows of battery packs. The passageways can be thermal conductive coils/pipes that can be placed at areas of hot spots of the battery packs during operation, as further described in FIG. 2.

In one embodiment, IT enclosure 100 can operate in Mode 1, where an immersion coolant channels through IT enclosure, e.g., immersion coolant enters from the supply channel and exits the return channel. For example, IT enclosure 100 can be one of a cluster of units connected in a series manner and the supply/return channels are interconnected to adjacent return/supply channels of adjacent units to circulate immersion coolant amongst the cluster of units (as further described in FIG. 6). In one embodiment, IT enclosure 100 can operate in Mode 2, where an immersion coolant is self-contained in IT enclosure 100 and the same immersion coolant recirculates from the supply channel to the return channel and back to the supply channel via pump 109 (as further described in FIG. 5).

FIG. 2 is a block diagram illustrating components of an IT cooling enclosure according to one embodiment. IT cooling enclosure can include coolers 103A-103B and cooling fluid distributor 107. The cooling fluid distributor 107 can receive a cooling fluid from an external source and distributes the cooling fluid to the individual coolers 103A-103B.

Adjacent to the coolers 103A-103B are battery spacings 201A-201C. Battery spacings 201A-201C can be dedicated enclosure slots that are configured to receive battery packs in various dimensions/arrangements (such as battery packs 105A-F of FIG. 1) and the battery spacings can secure the battery packs to IT enclosure 100. In one embodiment, battery spacings 201A-201C are disposed along passageways 203, where passageways 203 can be one or more flow paths for immersion coolant fluid to pass through the battery packs and/or the coolers 103A-103B. In one embodiment, passageways 203 can be arranged so that passageways 203 overlays locations of expected battery pack hot spots when battery packs are in operation (e.g., charge/discharge mode). The battery packs can be used as backup power for one or more servers of a data center.

The servers of a data center can be configured to provide IT services. Specifically, the servers may include a host server (referred to as a host node) and/or one or more compute servers (also referred to as computing nodes, such as CPU server and GPU server). The host server (having one or more CPUs) typically interfaces with clients (not shown) over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. In one embodiment, the servers can perform any type of computing task and/or can be any type of computing device (e.g., a server, a storage device, etc.). In one embodiment, the servers can be edge computing devices. Thus, while the servers provide the IT services, each of the servers can be powered by the battery packs.

In one embodiment, IT enclosure 100 includes supply channel 205 and return channel 207 as part of the flow management system. Supply and return channels allow immersion coolant to circulate within IT enclosure 100 via one or more fluid pumps 211. In one embodiment, IT enclosure 100 includes bottom return channel 209 at a bottom portion of IT enclosure 100 to direct immersion coolant from return channel to supply channel for recirculation.

FIG. 3 shows the system assembly for cooling system 100 including the cooler system 305, flow management system 303 and the IT container 101. Cooler system 305 can include cooling fluid distributor 107 fluidly coupled to coolers 103A-103C. Each cooler 103A-103C can be fluidly coupled to the enclosure-level cooling fluid distributor 107 to receive a cooling liquid. For example, each of coolers 103A-103C can be coupled to a supply line 328A-C and a return line 330A-C and the supply/return lines 328A-C, 330A-C are fluidly coupled to enclosure supply line 302 and return line 304 of the cooling fluid distributor 107. Enclosure supply/return lines 302, 304 can function as the liquid supply/return that delivers/returns cooling liquid to the supply/return lines 328, 330, which in turn, delivers/returns cooling liquid to coolers 103A-103C. Control valves 308A-C can be disposed on the supply lines 328A-C and/or return lines 330A-C to control a flow of cooling liquid to corresponding coolers 103A-103C. Enclosure lines 302, 304 can further be fluidly coupled a facility cooling system. For example, in one embodiment, the ends of supply/return lines 302, 304 are coupled with female connectors 315, 317. Female connectors 315, 317 can interface with complementary male connectors 319, 321 of a facility level cooling system. Such a facility level cooling system can include facility level fluid lines and a central cooler, as further shown in FIGS. 5-6.

In one embodiment, enclosure lines 302, 304 and supply/return lines 328A-C, 330A-C include liquid manifold, pipes, tubes, or hoses. In one embodiment, coolers 103A-C include cooling coils, and supply/return ends of respective cooling coils are coupled to female connectors 307A-C, 309A-C. In one embodiment, supply/return lines 328A-C, 330A-C are coupled to respective male connectors 311A-C, 313A-C. Female connectors 307A-C, 309A-C can interface with the complementary male connectors 311A-C, 313A-C for the fluid coupling.

In one embodiment, distributor 107 can be assembled as two separate assemblies, top assembly 305 and bottom assembly 306. Top assembly 305 can include enclosure distributor containment 310, enclosure lines 302/304, valves 308, lines 328/330, and connectors 311/313. Bottom assembly 306 can include coolers 103, and connectors 307/309. Since top assembly 305 is to be integrated to container 101 and bottom assembly 306 is to be inserted into container 101, the two assemblies can be installed or serviced separately. In one embodiment, top assembly 305 is integrated with bottom assembly 306 if the configuration and/or arrangement of the battery is predetermined and is fixed. Thus, the separate assemblies enable ease of installation and servicing of distributor 107.

In some embodiments, connectors 307A-313C, 315-321 are dripless blind-mating connectors. For example, male connectors 311 and 313 can be secured to enclosure distributor containment 310 at configurable outlet slots. The configurable outlet slots can be punched holes at predetermined distances along bottom side of containment 310. Male connectors 311, 313 can be coupled to complementary female connectors 307, 309 of coolers 103 when enclosure distributor containment 310 are placed on and secured to container 101 that houses the coolers 103 having exposed female connectors 307, 309.

Similarly, connectors 315 and 317 can be secured at another side of containment 310 (shown at left side, but can be the top). Male connectors 319 and 321 of facility lines can be secured to a fixed facility structure 323, such as a wall, or a wall mounted bracket, or a floor mounted bracket, etc. Female connectors 315 and 317 can then blind-mately interfaced with the complementary male connectors 319 and 321 when IT enclosure 100 is place into position against fixed facility structure 323.

In one embodiment, a supply temperature of each cooler 103A-103C can be used for controlling the corresponding valves 308A-308C, where the valve open ratio controls a flow rate of cooling liquid to the cooler. Each cooler 103 can include a heat exchanger (not shown) that receives the cooling liquid to transfer heat from the immersion coolant to the cooling liquid. This control design ensures that the temperature supplied by the coolers 103A-103C stay approximately the same by controlling the flow rate of cooling fluid delivered to coolers 103A-103C.

Flow management system 303 can include supply channel 205, return channels 207/209, parallelly arranged passageways 203 that allow coolant fluid to flow from supply channel 205 to return channel 207, and one or more fluid pumps 211 to pump the coolant fluid. Each of the assemblies 303, 305 can be assembled separately. The separation of the assemblies enables different cooler arrangements, and allows the flow management hardware system (e.g., flow rate, placement of passageways) to be tailored to the particular battery pack arrangements, and so on.

To ensure a flexible solution, individual coolers and/or battery packs can be swapped out when they become faulty without affecting the rest of the components in the IT enclosure 100. Thus, the design considers the three major systems as separate systems, but are integrated into one solution. In one embodiment, the flow managing system can further be separated into active components including the pumps, and inactive components, which are the fluid supply/return channels and the passageways. Thus, the modular assembly allows any of the systems and/or individual components to be removed for servicing without affecting the operation of the rest of the systems and/or components.

Figure 4:
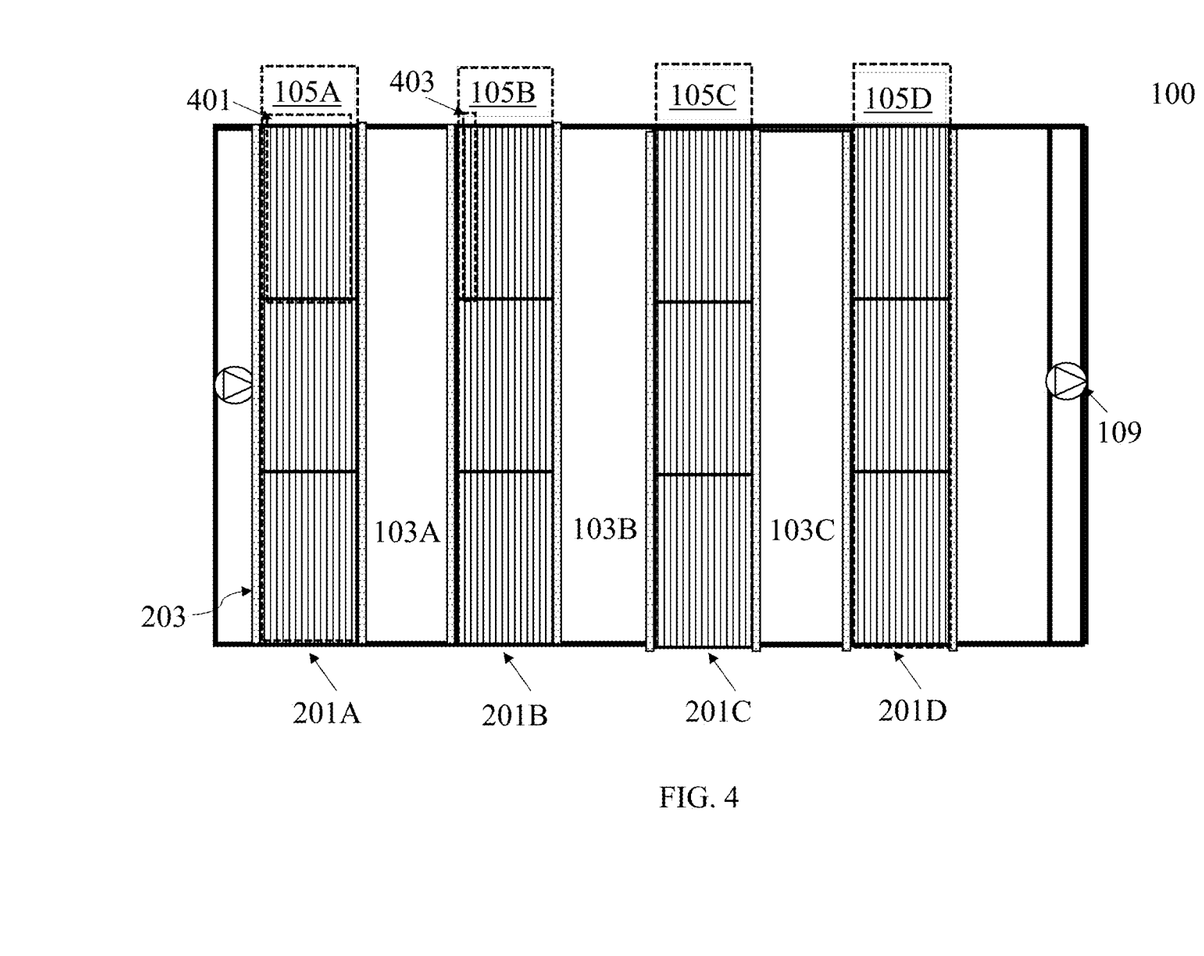
FIG. 4 is a block diagram illustrating a top view of a battery cells arrangement according to one embodiment.

FIG. 4 shows the IT enclosure with a particular battery pack arrangement according to one embodiment. Note that a feature of IT enclosure 100 is that the battery pack arrangement can be different for each IT enclosure and the corresponding flow management system can be configured (e.g., flow rate, placement of passageways, etc.) according to the battery pack thermal requirements and their arrangements. A particular arrangement allows immersion coolant to flow through several rows of battery cells, via passageways, to transfer heat from the battery to the coolers before immersion coolant is redirected to flow through another one or more rows of battery packs.

Figure 5:
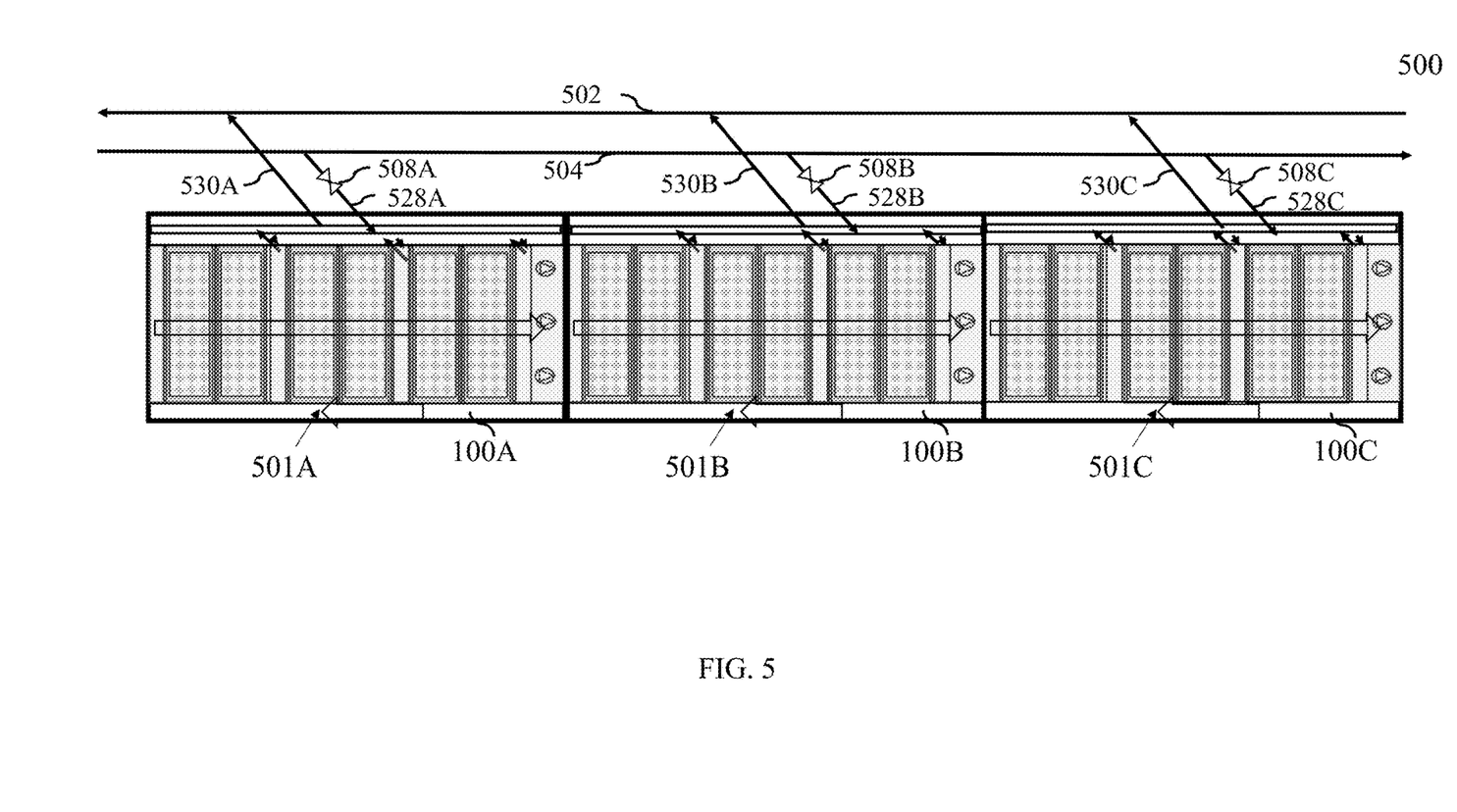
FIG. 5 is a block diagram illustrating a cooling system architecture with a cluster of IT enclosures according to one embodiment.

FIG. 5 shows a cooling system 500 with a cluster of IT enclosures operating in Mode 2. Cooling system 500 includes a cluster of IT enclosures 100A-100C, and central cooling liquid distributor lines 502, 504. Each of the IT enclosures 100A-100C is populated with battery packs.

In one embodiment, each of IT enclosure 100A-100C can be fluidly coupled to a cooling liquid provided by a facility cooling liquid distributor lines 502, 504. For example, supply and return enclosure lines (such as lines 302, 304 of FIG. 3) in the IT enclosures 100A-100C can be coupled to a supply line 528 and a return line 530 and the supply/return lines 528, 530 are fluidly coupled to facility supply/return lines 502, 504. A control valve 508 can be disposed on the supply line 528 to control the flow between the corresponding supply/return lines 528, 530 and facility lines 502, 504. Facility lines 502, 504 can further be fluidly coupled a central cooler (not shown) to provide a cooling source.

In one embodiment, a supply temperature of any of the coolers in the IT enclosures can be used for controlling the corresponding valves 508A-508C for the IT enclosures, where the valve open ratio controls a flow rate of cooling liquid to the respective IT enclosure. Each IT enclosure can include one or more coolers that include heat exchangers (not shown) to receive the cooling liquid. The heat exchanger exchanges heat between the immersion coolant and the cooling liquid. This control design ensures that the temperature supplied by any one of the coolers 103A-103C in a respective IT enclosure stay approximately the same by controlling the flow rate of cooling fluid delivered to the IT enclosures.

In one embodiment, IT enclosures 100A-100C in the cluster can be configured to operate in Mode 2, where the immersion coolant corresponding to each of the IT enclosures is self-contained in the respective IT enclosure, and the immersion coolant is recirculated therein. In some embodiments, because the immersion coolant within each IT enclosure is self-contained, each IT enclosure can be configured with an immersion coolant having different viscosities selected to meet the thermal requirements of the battery packs housed in the respective IT enclosure. In some embodiments, the temperature threshold of the battery packs, and/or a rate of flow of the immersion coolant can be managed independently for each of the IT enclosures, while the IT enclosures co-exists in a same cluster in cooling system 500. In one embodiment, flow rates 501A, 501B, and 501C can be different values depending on the thermal requirements of the battery packs housed within the respective IT enclosures 100A-100C. For example, if the battery pack requirements or discharge/charge rate of battery packs in IT enclosure 100A is much larger than that in IT enclosure 100B, then the flow rate 501A would be configured to be much greater than flow rate 501B.

Figure 6:
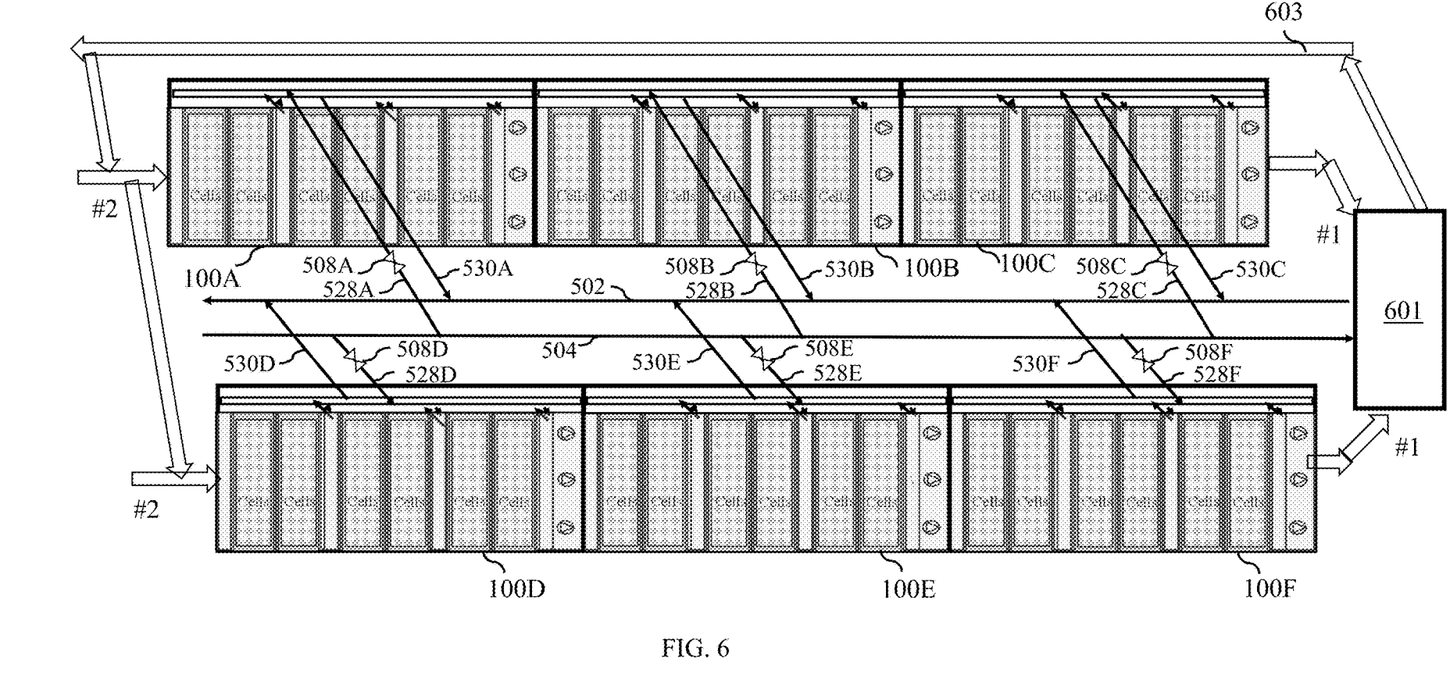
FIG. 6 is a block diagram illustrating another cooling system architecture with one or more clusters of IT enclosures according to one embodiment.

FIG. 6 shows a cooling system 600 with a cluster of IT enclosures operating in Mode 1. Cooling system 600 can include a central cooler 601, a first cluster of IT enclosures 100A-100C, a second cluster of IT enclosures 100D-100F, facility cooling liquid distributor lines 502/504, and a coolant line 603. Each of the IT enclosures 100A-100F can be populated with battery packs (cells).

In one embodiment, each of IT enclosure 100A-100F can be fluidly coupled to a cooling liquid provided by the facility cooling liquid distributor lines 502, 504. For example, supply and return enclosure lines (such as lines 302, 304 of FIG. 3) in the IT enclosures 100A-100F can be coupled to a supply line 528 and a return line 530 and the supply/return lines 528, 530 are fluidly coupled to facility supply/return lines 502, 504. A control valve 508 can be disposed on the supply line 528 to control the flow between the corresponding supply/return lines 528, 530 and facility lines 502, 504. Facility lines 502, 504 can further be fluidly coupled a central cooler 601 to provide a cooling source.

In one embodiment, a supply temperature of any of the coolers in the IT enclosures can be used for controlling the corresponding valves 508A-508F for the IT enclosures, where the valve open ratio controls a flow rate of cooling liquid to the respective IT enclosure. Each IT enclosure can include one or more coolers that include heat exchangers (not shown) to receive the cooling liquid. The heat exchanger exchanges heat between the immersion coolant and the cooling liquid. This control design ensures that the temperature supplied by any one of the coolers 103A-103F in a respective IT enclosure stay approximately the same by controlling the flow rate of cooling fluid delivered to the IT enclosures.

In another embodiment, central cooler 601 can provide direct cooling for the immersion coolant in a redundant fashion as a fail-safe mechanism, via coolant line 603. For example, as shown in FIG. 6, the two clusters of IT enclosures (100A-100C and 100D-100F) can be configured to operate in Mode 1, where the immersion coolant passes through the clusters of IT enclosures in a series manner. In this scenario, where the IT enclosures are arranged in the series manner, the immersion coolant is directed to flow through a cluster of IT enclosures from supply port #2 to exit port #1. The immersion coolant at exit port #1 is then redirected to central cooler 601, where immersion coolant passes through heat exchanger coolant coils (not shown) of the central cooler where heat is extracted from the immersion coolant. The immersion coolant then exits central cooler 601 and returns to supply port #2, via coolant line 603.

In this design, if facility liquid cooling lines 502, 504 fails or if any coolers in any of the IT enclosures fails, a cooling source for immersion coolant can still be delivered by central cooler 601, via coolant line 603. Thus, the redundancy in fluid recirculation (since there are at least two cooling paths via coolant line 603, or cooling liquid lines 502, 504) provides a safe-fail mechanism. In one embodiment, the immersion coolant type, the flow rate of coolant and temperature control of the battery packs are managed uniformly for each of the IT enclosures in a cluster.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An information technology (IT) enclosure, comprising:
   an IT container having immersion coolant contained therein;
   a plurality of cooler trays and a plurality of dedicated battery spacings that are alternately arranged in a series manner within the IT container, each cooler tray to house a cooler, each battery spacing to house one or more rows of battery packs, each battery pack comprising a plurality of battery cells arranged therein; and
   a supply channel disposed at a first side of the IT container to supply the immersion coolant, the immersion coolant is circulated to the alternate plurality of cooler trays housing the coolers and the plurality of dedicated battery spacings housing the battery packs, wherein, when in operation, the immersion coolant transfers a thermal load from the one or more rows of battery packs to the coolers;
   wherein the immersion coolant is directed to one or more rows of battery packs for the battery packs to transfer heat to the immersion coolant, and the heat of the immersion coolant is extracted to the respective coolers before the immersion coolant is directed to another row of battery packs.

2. The IT enclosure of claim 1, further comprising a return channel disposed at a second side of the IT container and a bottom return channel disposed at a bottom portion of the IT container to return the recirculated immersion coolant from the return channel to the supply channel.

3. The IT enclosure of claim 1, further comprising a plurality of passageways disposed near the plurality of cooler trays and the dedicated battery spacings that are arranged in the series manner, wherein the plurality of passageways direct a flow of the immersion coolant to transfer the thermal load from the plurality of battery cells to the plurality of coolers.

4. The IT enclosure of claim 1, wherein the IT enclosure is assembled modularly using a cooler system, a flow management system, and the IT container.

5. The IT enclosure of claim 1, further comprising a cooling fluid distributor to distribute cooling fluid from a central cooler to each of the plurality of coolers to extract heat from the one or more coolers.

6. The IT enclosure of claim 1, wherein the immersion coolant flows in a direction of the plurality of cooler trays and the plurality of dedicated battery spacings that are alternately arranged in the series manner.

7. The IT enclosure of claim 1, wherein a flow rate of the immersion coolant at the IT enclosure is managed independently of a flow rate of immersion coolant at another IT enclosure, wherein the IT enclosure and the another IT enclosure are comprised in a cluster of IT enclosures of a cooling system.

8. The IT enclosure of claim 1, wherein a temperature of the plurality of battery cells is managed independently of a plurality of battery cells of another IT enclosure, wherein the IT enclosure and the another IT enclosure are comprised in a cluster of IT enclosures of a cooling system.

9. The IT enclosure of claim 1, wherein the coolers include at least a first cooler and a second cooler and wherein a flow rate of a cooling fluid at the first cooler is different than a flow rate of the cooling fluid at the second cooler.

10. The IT enclosure of claim 1, further comprising a fluid pump disposed at the supply channel to pump the immersion coolant from the supply channel to the plurality of cooler trays and the plurality of dedicated battery spacings.

11. A cooling system, comprising:
    a cluster of information technology (IT) enclosures arranged in a series manner;
    a central cooler; and
    a cooling fluid distributor coupled to the central cooler to distribute cooling fluid from the central cooler to the cluster of IT enclosures,
    wherein each of the cluster of IT enclosures comprises:
      an IT container having immersion coolant contained therein;
      a plurality of cooler trays and a plurality of dedicated battery spacings that are alternately arranged in a series manner within the IT container, each cooler tray to house a cooler, each battery spacing to house one or more rows of battery packs, each battery pack comprising a plurality of battery cells arranged therein; and
      a supply channel disposed at a first side of the IT container to supply the immersion coolant, the immersion coolant is circulated to the alternate plurality of cooler trays housing the coolers and the plurality of dedicated battery spacings housing the battery packs, wherein, when in operation, the immersion coolant transfers a thermal load from the one or more rows of battery packs to the coolers.

12. The cooling system of claim 11, wherein each of the cluster of IT enclosures further comprises a return channel disposed at a second side of the IT container and a bottom return channel disposed at a bottom portion of the IT container to return the recirculated immersion coolant from the return channel to the supply channel.

13. The cooling system of claim 11, wherein each of the cluster of IT enclosures further comprises a plurality of passageways disposed near the plurality of cooler trays and the dedicated battery spacings that are arranged in the series manner, wherein the plurality of passageways direct a flow of the immersion coolant to transfer a thermal load from the plurality of battery cells to the plurality of coolers.

14. The cooling system of claim 11, wherein the IT enclosure is assembled modularly using a cooler system, a flow management system, and the IT container.

15. The cooling system of claim 11, wherein the immersion coolant is directed to one or more rows of battery packs for the battery packs to transfer heat to the immersion coolant, and the heat of the immersion coolant is extracted to a cooler before the immersion coolant is directed to another row of battery packs.

16. The cooling system of claim 11, wherein the immersion coolant flows in a direction of the plurality of cooler trays and the plurality of dedicated battery spacings that are alternately arranged in the series manner.

17. The cooling system of claim 11, wherein a flow rate of immersion coolant of a first IT enclosure is managed independently of a flow rate of immersion coolant of a second IT enclosure, wherein the first and the second IT enclosures are comprised in the cluster of IT enclosures.

18. The cooling system of claim 11, wherein a temperature of a plurality of battery cells of a first IT enclosure is managed independently of a plurality of battery cells of a second IT enclosure, wherein the first and the second IT enclosures are comprised in the cluster of IT enclosures.

19. A cooling system, comprising:
   a cluster of information technology (IT) enclosures arranged in a series manner;
   a central cooler; and
   a cooling fluid distributor coupled to the central cooler to distribute cooling fluid from the central cooler to the cluster of IT enclosures,
   wherein each of the cluster of IT enclosures comprises:
      an IT container having immersion coolant contained therein;
      a plurality of cooler trays and a plurality of dedicated battery spacings that are alternately arranged in a series manner within the IT container, each cooler tray to house a cooler, each battery spacing to house one or more rows of battery packs, each battery pack comprising a plurality of battery cells arranged therein;
      a supply channel disposed at a first side of the IT container to supply the immersion coolant, the immersion coolant is circulated to the alternate plurality of cooler trays housing the coolers and the plurality of dedicated battery spacings housing the battery packs, wherein, when in operation, the immersion coolant transfers a thermal load from the one or more rows of battery packs to the coolers; and
      a return channel disposed at another side of the IT container, wherein the immersion coolant recirculates in a loop between the cluster of IT enclosures and the central cooler.

* * * * *